(12) United States Patent
Kim et al.

(10) Patent No.: US 10,651,224 B2
(45) Date of Patent: May 12, 2020

(54) SEMICONDUCTOR PACKAGE INCLUDING A REDISTRIBUTION LINE

(71) Applicant: SAMSUNG ELECTRONICS CO., LTD., Suwon-si, Gyeonggi-do (KR)

(72) Inventors: Ji Hwang Kim, Cheonan-si (KR); Chajea Jo, Yongin-si (KR); Hyoeun Kim, Cheonan-si (KR); Jongbo Shim, Asan-si (KR); Sang-uk Han, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/058,451

(22) Filed: Aug. 8, 2018

(65) Prior Publication Data

US 2019/0214423 A1    Jul. 11, 2019

(30) Foreign Application Priority Data

Jan. 11, 2018 (KR) .................. 10-2018-0003771

(51) Int. Cl.
*H01L 31/00* (2006.01)
*H01L 27/146* (2006.01)
*H01L 23/00* (2006.01)

(52) U.S. Cl.
CPC ........ *H01L 27/14634* (2013.01); *H01L 24/05* (2013.01); *H01L 24/08* (2013.01); *H01L 24/09* (2013.01); *H01L 24/16* (2013.01); *H01L 27/14618* (2013.01); *H01L 27/14636* (2013.01); *H01L 27/14632* (2013.01); *H01L 27/14687* (2013.01); *H01L 2224/02372* (2013.01); *H01L 2224/02377* (2013.01); *H01L 2224/02381* (2013.01); *H01L 2224/0557* (2013.01); *H01L 2224/08145* (2013.01); *H01L 2224/09181* (2013.01); *H01L 2224/16104* (2013.01); *H01L 2224/16145* (2013.01); *H01L 2224/81005* (2013.01); *H01L 2924/18161* (2013.01)

(58) Field of Classification Search
None
See application file for complete search history.

(56) References Cited

U.S. PATENT DOCUMENTS 5,724,610 A    3/1998  Han et al.
6,687,149 B2   2/2004  Chernobrod et al.
(Continued)

OTHER PUBLICATIONS

U.S. Office Action issued in corresponding U.S. Appl. No. 16/507,623 dated Jan. 9, 2020.

*Primary Examiner* — Hung K Vu
(74) *Attorney, Agent, or Firm* — F. Chau & Associates, LLC

(57) ABSTRACT

A semiconductor package includes a first semiconductor chip. A second semiconductor chip is below the first semiconductor chip. A third semiconductor chip is below the second semiconductor chip. The second semiconductor chip includes a first surface in direct contact with the first semiconductor chip, and a second surface facing the third semiconductor chip. A first redistribution pattern is on the second surface of the second semiconductor chip and is electrically connected to the third semiconductor chip. The third semiconductor chip includes a third surface facing the second semiconductor chip. A conductive pad is on the third surface.

19 Claims, 7 Drawing Sheets

(56) References Cited

U.S. PATENT DOCUMENTS

| | | |
|---|---|---|
| 8,946,784 B2 | 2/2015 | Chen et al. |
| 9,196,547 B2 | 11/2015 | Lin et al. |
| 9,324,756 B2 | 4/2016 | Yu et al. |
| 9,337,235 B2 | 5/2016 | Chen et al. |
| 9,627,430 B2 | 4/2017 | Kao et al. |
| 9,673,248 B2 | 6/2017 | Kuo et al. |
| 9,704,827 B2 | 7/2017 | Huang et al. |
| 2002/0003167 A1 | 1/2002 | Cheng |
| 2012/0154878 A1 | 6/2012 | Son et al. |
| 2014/0141569 A1 | 5/2014 | Jo et al. |
| 2016/0141280 A1 | 5/2016 | Lin et al. |
| 2016/0351499 A1* | 12/2016 | Kitada ................ H01L 25/0657 |
| 2018/0040658 A1* | 2/2018 | Kang ................ H01L 31/0203 |

\* cited by examiner

SEMICONDUCTOR PACKAGE INCLUDING A REDISTRIBUTION LINE

CROSS-REFERENCE TO RELATED APPLICATION

This U.S. nonprovisional application claims priority under 35 U.S.C § 119 to Korean Patent Application No. 10-2018-0003771 filed on Jan. 11, 2018, in the Korean Intellectual Property Office, the disclosure of which is incorporated by reference herein in its entirety.

TECHNICAL FIELD

Exemplary embodiments of the present inventive concept relate to a semiconductor package, and more particularly to a semiconductor package including a redistribution line.

DISCUSSION OF RELATED ART

Image sensors, such as CCD sensors or CMOS image sensors, may be used in various electronic products, such as mobile phones, digital cameras, optical mice, security cameras, and biometric recognition devices. As electronic products are miniaturized and multi-functionalized, a semiconductor package including an image sensor may be relatively small and relatively high density. The semiconductor package may have relatively low power consumption, multi-functionality, relatively high-speed signal processing, relatively high reliability, relatively low price, and relatively sharp image quality.

SUMMARY

An exemplary embodiment of the present inventive concept provides a semiconductor package capable of performing read operation at relatively high speed and increasing the degree of wiring freedom.

According to an exemplary embodiment of the present inventive concept, a semiconductor package includes a first semiconductor chip. A second semiconductor chip is below the first semiconductor chip. A third semiconductor chip is below the second semiconductor chip. The second semiconductor chip includes a first surface in direct contact with the first semiconductor chip, and a second surface facing the third semiconductor chip. A first redistribution pattern is on the second surface of the second semiconductor chip and is electrically connected to the third semiconductor chip. The third semiconductor chip includes a third surface facing the second semiconductor chip. A conductive pad is on the third surface.

According to an exemplary embodiment of the present inventive concept, a semiconductor package includes a first semiconductor chip. A second semiconductor chip is below the first semiconductor chip. A third semiconductor chip is below the second semiconductor chip. The first semiconductor chip and the second semiconductor chip have sidewalls aligned with each other. The third semiconductor chip has a width less than that of the second semiconductor chip. The third semiconductor chip includes a first surface facing the second semiconductor chip and a first redistribution pattern on the first surface.

According to an exemplary embodiment of the present inventive concept, a semiconductor package includes an image sensor chip. A logic chip is disposed on the image sensor chip. A memory chip is spaced apart from the logic chip. Sidewalls of the image sensor chip and the logic chip are substantially aligned with each other along a direction orthogonal to an upper surface of the image sensor chip. A sidewall of the memory chip is spaced apart from the sidewalk of the image sensor chip and the logic chip. A first redistribution pattern is disposed on a surface of the logic chip facing the memory chip. A second redistribution pattern is disposed on a surface of the memory chip facing the logic chip. The first redistribution pattern is electrically connected with the second redistribution pattern.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF EMBODIMENTS

Figure 1A:
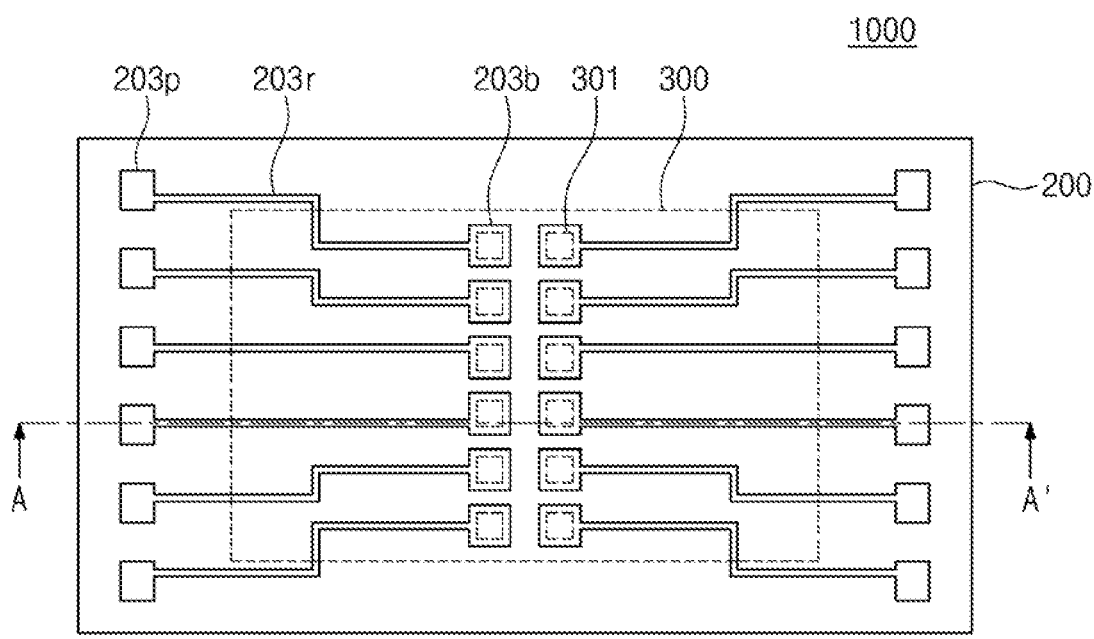
FIG. 1A is a plan view of a semiconductor package according to an exemplary embodiment of the present inventive concept.

Exemplary embodiments of the present inventive concept will be described below in more detail below with reference to the accompanying drawings. Like reference numerals may refer to like elements throughout the specification and drawings.

Figure 1B:
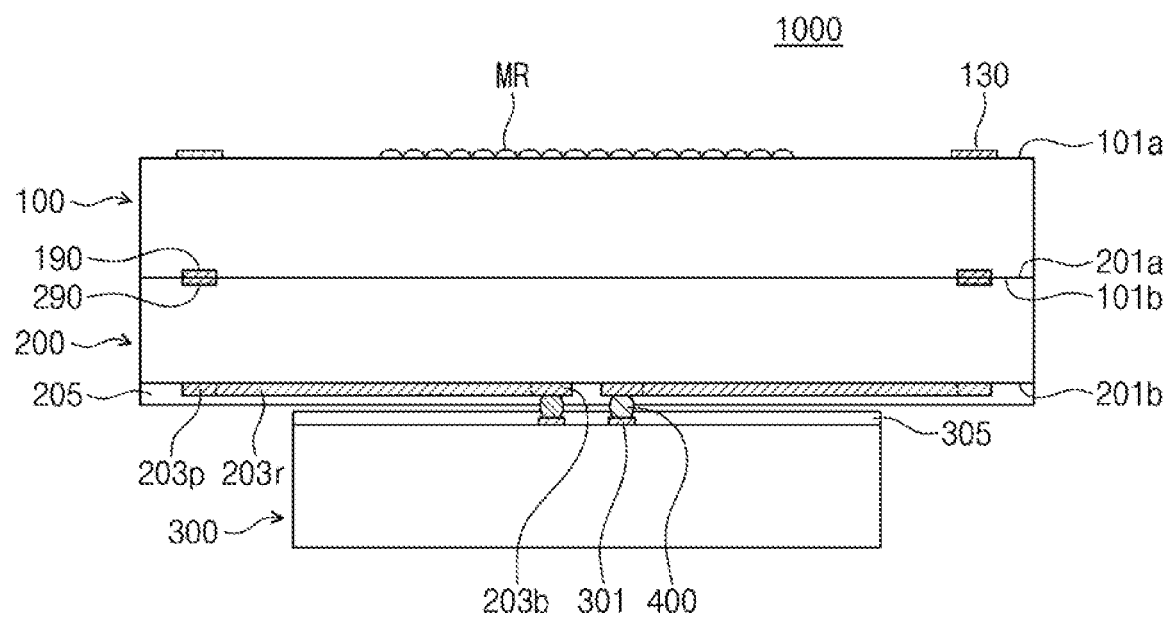
FIG. 1B is a cross-sectional view taken along line A-A' of FIG. 1A.

FIG. 1A is a plan view of a semiconductor package according to an exemplary embodiment of the present inventive concept. FIG. 1B is a cross-sectional view taken along line A-A' of FIG. 1A.

Referring to FIGS. 1A and 1B, a semiconductor package 1000 according an exemplary embodiment of the present inventive concept may include a first semiconductor chip 100, a second semiconductor chip 200 below the first semiconductor chip 100, and a third semiconductor chip 300 below the second semiconductor chip 200. The first to third semiconductor chips 100, 200, and 300 may have different functions from each other. For example, the first semiconductor chip 100 may be an image sensor chip, the second semiconductor chip 200 may be a logic chip (e.g., a logic chip that drives the image sensor chip) and the third semiconductor chip 300 may be a memory chip (e.g., a memory chip that stores data generated in the logic chip). The first and second semiconductor chips 100 and 200 may have substantially the same width as each other. The first and second semiconductor chips 100 and 200 may have sidewalls that are vertically aligned with each other. The first and second semiconductor chips 100 and 200 may he in direct contact with each other.

The first semiconductor chip 100 may have a first top surface 101a and a first bottom surface 101b. The first semiconductor chip 100 may include a first upper conductive pad 130 and a micro-lens array MR that are disposed on the first top surface 101a. The first semiconductor chip 100 may include a first lower conductive pad 190 adjacent to the first bottom surface 101b. For example, a bottom surface of the first lower conductive pad 190 may be aligned with the first bottom surface 101b of the first semiconductor chip 100. The first semiconductor chip 100 may include, for example, an image sensor chip.

The second semiconductor chip 200 may include a second top surface 201a in direct contact with the first semiconductor chip 100 (e.g., with the bottom surface 101b of the first semiconductor chip 100) and a second bottom surface 201b adjacent to the third semiconductor chip 300. For example, the second bottom surface 201b of the second semiconductor chip 200 may face an upper surface of the third semiconductor chip 300, and the third semiconductor chip 300 may be spaced apart from the second semiconductor chip 200 along a direction orthogonal to the upper surface of the third semiconductor chip 300. The second semiconductor chip 200 may include a second upper conductive pad 290 adjacent to the second top surface 201a. An upper surface of the second upper conductive pad 290 may be aligned with the second top surface 201a of the second semiconductor chip. The second upper conductive pad 290 may be in direct contact with the first lower conductive pad 190. The second upper conductive pad 290 and the first lower conductive pad 190 may each include, for example, copper. A passivation layer might not be disposed between the first and second semiconductor chips 100 and 200. The second semiconductor chip 200 may include a redistribution pattern 203p, 203r, and 203b on the second bottom surface 201b. The redistribution pattern 203p, 203r, and 203b may be in direct contact with the second bottom surface 201b. The redistribution pattern 203p, 203r, and 203b may include a first redistribution conductive pad 203p, a second redistribution conductive pad 203b, and a first redistribution line 203r connecting the first and second redistribution conductive pads 203p and 203b. A second passivation layer 205 may substantially cover the second bottom surface 201b and the redistribution pattern 203p, 203r, and 203b of the second semiconductor chip 200. For example, the second passivation layer 205 may cover side and bottom surfaces of the redistribution pattern 203p, 203r, and 203b. For example, the second semiconductor chip 200 may include a logic chip that drives the first semiconductor chip 100.

The third semiconductor chip 300 may have a width less than that of the second semiconductor chip 200. The third semiconductor chip 300 may accordingly have a sidewall that is not vertically aligned with that of the second semiconductor chip 200. Thus, the sidewalls of the third semiconductor chip 300 may be spaced apart from the sidewall of the first and second semiconductor chips 100 and 200. The sidewall of the third semiconductor chip 300 may overlap the redistribution pattern 203p, 203r, and 203b (e.g., the redistribution line 203r) of the second semiconductor chip 200. The second semiconductor chip 200 may he spaced apart from the third semiconductor chip 300. The third semiconductor chip 300 may include a third conductive pad 301 at its upper portion. For example, the third conductive pad 301 may be in direct contact with the upper surface of the third semiconductor chip 300 facing the second semiconductor chip 200 along the direction orthogonal to the upper surface of the third semiconductor chip 300. The third conductive pad may overlap the second redistribution conductive pad 203b of the second substrate 200 along the direction orthogonal to the upper surface of the third semiconductor chip 300. The third conductive pad 301 may be adjacent to a center of the third semiconductor chip 300. A connection structure 400 such as solder ball may be disposed between the third conductive pad 301 and the second redistribution conductive pad 203b. The connection structure 400 may electrically connect the second and third semiconductor chips 200 and 300. A third passivation layer 305 may be disposed on (e.g., may substantially cover) the top surface of the third semiconductor chip 300. The third semiconductor chip 300 may include, for example, a memory chip that stores data generated in the second semiconductor chip 200. For example, the third semiconductor chip 300 may be a dynamic random access memory (DRAM) chip.

As an example, of the structure of the first, second and third semiconductor chips 100, 200 and 300, a logic chip may be bonded to an image sensor chip to which a memory chip is flip-chip bonded. This configuration may provide a relatively fast readout function, compared to the case that the memory chip is relatively far away from the image sensor chip. When the memory chip is a DRAM chip, position and size of input/output terminals may be standardized, and thus manufacturing costs may be reduced, manufacturing yield may be increased, and an occurrence of manufacturing errors or defects may be reduced or eliminated. Thus, the logic chip and the DRAM chip may be different in size and position of input/output terminals. According to an exemplary embodiment of the present inventive concept, since the second semiconductor chip 200, which may serve as the logic chip, includes the redistribution pattern 203p, 203r, and 203b, it may be possible to increase the freedom degree of wiring for connection between the second and third semiconductor chips 200 and 300.

Figure 2:
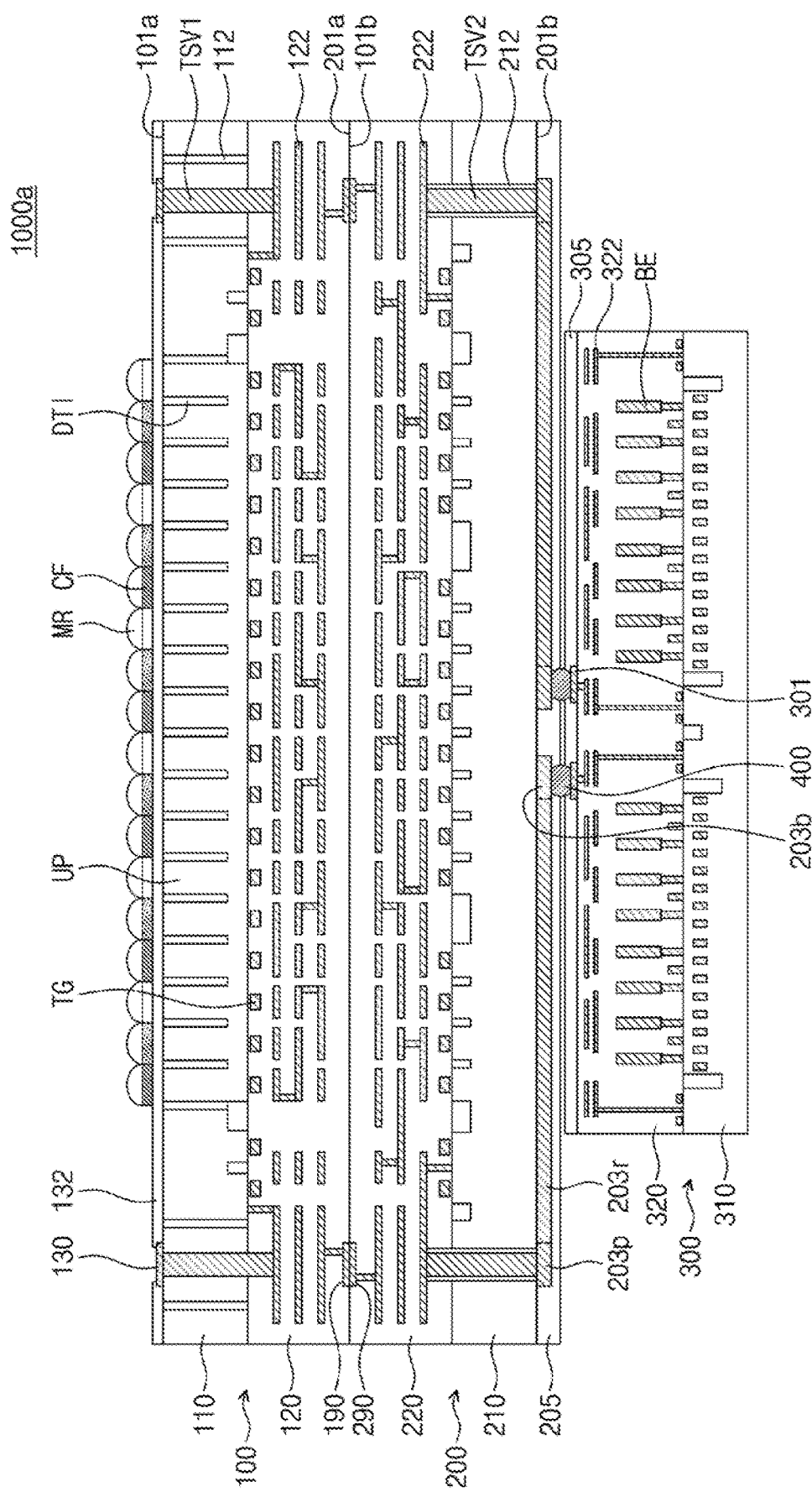
FIG. 2 is a cross-sectional view of a semiconductor package according to an exemplary embodiment of the present inventive concept.

FIG. 2 is a cross-sectional view of a semiconductor package according to an exemplary embodiment of the present inventive concept.

Referring to FIG. 2, a semiconductor package 1000a according to an exemplary embodiment of the present inventive concept may include a first semiconductor chip 100, a second semiconductor chip 200, and a third semiconductor chip 300. The components and features of the first, second and third semiconductor chips 100, 200 and 300 described above in more detail with reference to FIGS. 1A and 1B may similarly apply to the first, second and third logic chips described with reference to FIG. 2. The first semiconductor chip 100 may be an image sensor chip. The first semiconductor chip 100 may include a first semiconductor substrate 110 and a first insulation layer 120 on (e.g., in direct contact with) the first semiconductor substrate 110. The first insulation layer 120 may be provided thereon with the first semiconductor substrate 110 that is turned upside down. The first insulation layer 120 may have a single layer structure, or a multiple layer structure including, for example, one or more of a silicon oxide layer, a silicon nitride layer, a silicon oxynitride layer, or a porous low-k dielectric layer. The first semiconductor substrate 110 may have a top surface corresponding to the first top surface 101a of the first substrate 100 (see. e.g., FIG. 1B). The first insulation layer 120 may have a bottom surface corresponding to the first bottom surface 101b of the first substrate 100 (see, e.g., FIG. 1B). Deep device isolation layers DT1 may be provided in the first semiconductor substrate 110, which may separate unit pixels UP from each other. As an example, the first semiconductor substrate 110 may include a plurality of photodiode regions each of which is disposed on a corresponding one of the unit pixels UP.

A first passivation layer 132 may substantially cover the first top surface 101a, or the top surface of the first semiconductor substrate 110. The first passivation layer 132 may be or include, for example, a silicon nitride layer or a polyimide layer. The first passivation layer 132 may be provided thereon with a plurality of color filters CF correspondingly disposed on the unit pixels UP. A micro-lens array MR may be disposed on the color filters CF. For example, the micro lens-array CR may include a lens respectively disposed on each of the color filters CF. For example, the color filters CF and the lenses may be arranged in a one to one configuration on the first passivation layer 132. First detour lines DT1 may be positioned below boundaries between adjacent filters of the color filters CF. Thus, each first detour line DT1 may overlap a portion of two adjacent color filters CF that are in direct contact with each other. The first detour lines DT1 may extend along a direction orthogonal to the upper surface of the first semiconductor substrate 110. The first detour lines DT1 may extend from a bottom surface of the first passivation layer 132 into the first semiconductor substrate 110. The first detour lines DT1 might not hilly penetrate a full depth of the first semiconductor substrate 110. Thus, bottom surfaces of each of the first detour lines DT1 may be positioned above a bottom surface of the first semiconductor substrate 110. The first semiconductor substrate 110 may be provided thereon with a plurality of transfer gates TG each of which may transfer charges generated in the photodiode region. The first insulation layer 120 may include therein a plurality of first wiring lines 122. The first semiconductor substrate 110 may be provided on its edge with a first through vias TSV1 that penetrates the first semiconductor substrate 110. The first through via TSV1 may partially penetrate the first insulation layer 120 and may be electrically connected with the first wiring line 122. A first via insulation layer 112 may be disposed adjacent to the first through via TSV1. The first via insulation layer 112 may be spaced apart from the first through via TSV1. As an example, when viewed in plan, the first via insulation layer 112 may surround the first through via. TSV1. The first via insulation layer 112 may insulate the first through via TSV1 from the first semiconductor substrate 110. The first via insulation layer 112 may penetrate the first semiconductor substrate 110. The first semiconductor chip 100 may include a first lower conductive pad 190 including a bottom surface that is coplanar with the first bottom surface 101b, or the bottom surface of the first insulation layer 120.

The second semiconductor chip 200 may include a second semiconductor substrate 210 and a second insulation layer 220 on the second semiconductor substrate 210. The second semiconductor substrate 210 may have a bottom surface corresponding to the second bottom surface 201b of the second substrate 200 (see, e.g., FIG. 1B). The second insulation layer 220 may have a top surface corresponding to the second top surface 201a of the second substrate 200 (see, e.g., FIG. 1B). The second insulation layer 220 may have a single layer structure or a multiple layer structure including, for example, one or more of a silicon oxide layer, a silicon nitride layer, a silicon oxynitride layer, or a porous low-k dielectric layer. The second semiconductor substrate 210 may be provided thereon with a plurality of transistors and a redistribution pattern 203p, 203r, and 203b. The transistors may be electrically connected to a plurality of second wiring lines 222 disposed in the second insulation layer 220. The second semiconductor chip 200 may include a second through via TSV2 that penetrates an edge of the second semiconductor substrate 210 and electrically connects the second wiring line 222 to the redistribution pattern 203p, 203r, and 203b. The second semiconductor chip 200 may include a second via insulation layer 212 that penetrates the second semiconductor substrate 210 and surrounds the second through via TSV2 (e.g., when viewed front a plan view). The second via insulation layer 212 may be in direct contact with the second through via TSV2. The second through via TSV2 may vertically overlap a first redistribution conductive pad 203p of the redistribution pattern 203p, 203r, and 203b (e.g., along the direction orthogonal to the upper surface of the third semiconductor chip 300).

The third semiconductor chip 300 may include a third semiconductor chip 310 and a third insulation layer 320 on the third semiconductor substrate 310. The third insulation layer 320 may have a single layer structure or a multiple layer structure including, for example, one or more of a silicon oxide layer, a silicon nitride layer, a silicon oxynitride layer, or a porous low-k dielectric layer. The third insulation layer 320 may be provided therein with a plurality of third wiring lines 322 and a plurality of capacitors having bottom electrodes BE. The third insulation layer 320 may have a top surface provided thereon with a third conductive pad 301 electrically connected to the third wiring line 322. The top surface of the third insulation layer 320 may be substantially covered with a third passivation layer 305. A connection structure 400 (e.g., a solder ball) may connect (e.g., may electrically connect) the third conductive pad 301 to a second redistribution conductive pad 203b of the redistribution pattern 203p, 203r, and 203b.

According to an exemplary embodiment of the present inventive concept, the semiconductor package 1000a may be configured to allow the redistribution pattern 203p, 203r, and 203b to be positioned in various locations, and thus the second through via TSV2 may be positioned in various locations. For example, according to an exemplary embodiment of the present inventive concept, the second through silicon vias TSV2 might not overlap the third semiconductor chip along the direction orthogonal to the upper surface of the third semiconductor chip 300. A DRAM chip may include a plurality of Input/output terminals that are disposed on a center of the DRAM chip. When the redistribution pattern 203p, 203r, and 203b are omitted, the second through via TSV2 be disposed adjacent to a center of the second semiconductor chip 200 to correspond to the position of the third conductive pad 301 that is adjacent to the center of the third semiconductor chip 300 serving as the DRAM chip. The second semiconductor chip 200 may have a circuit including transistors and the second wiring lines 222, and the density of the circuit may he greater on a center of the second semiconductor chip 200 than on an edge of the second semiconductor chip 200. Positioning the second through via TSV2 in the center of the second semiconductor chip 200 may include moving a relatively higher density circuit adjacent to an edge of the second semiconductor chip 200, which may result in increasing a planar area of the second semiconductor chip 200. According to an exemplary embodiment of the present inventive concept, the redistribution pattern 203p, 203r, and 203b may be configured to allow the second through via TSV2 to be positioned on the relatively less crowded edge of the second semiconductor chip 200, and thus the second semiconductor chip 200 may maintain a relatively small size. In addition, the semiconductor package 1000a may accordingly decrease in size.

Figure 3:
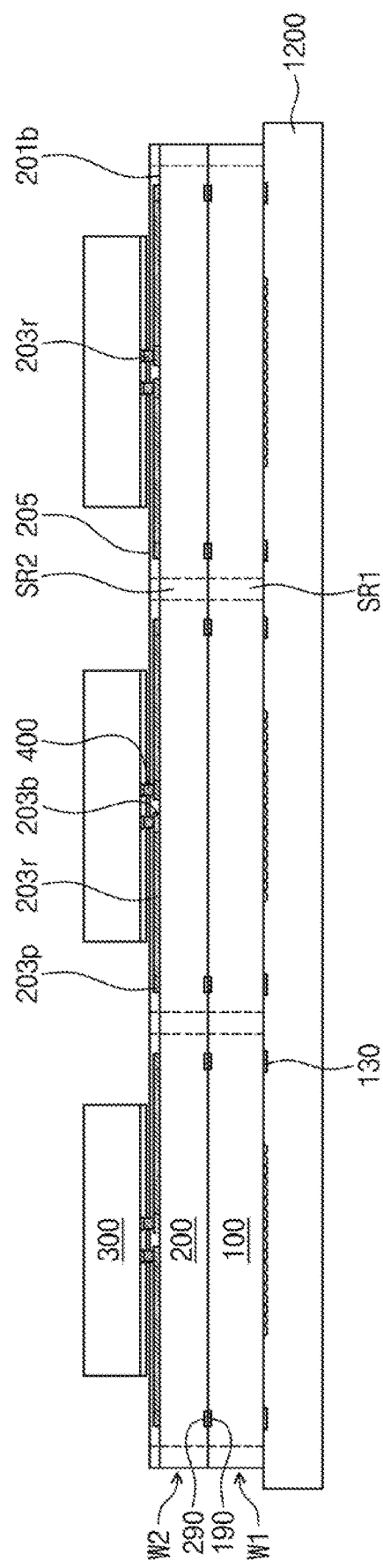
FIG. 3 is a cross-sectional view of a method of fabricating a semiconductor package according to an exemplary embodiment of the present inventive concept.

FIG. 3 is a cross-sectional view of a method of fabricating a semiconductor package according to an exemplary embodiment of the present inventive concept.

Referring to FIGS. 2 and 3, a first wafer W1 may be fabricated to include first semiconductor chips 100. The first wafer W1 may include a first upper conductive pad 130, a first lower conductive pad 190, and a first insulation layer 120. The first semiconductor chips 100 need not yet be divided into pieces. The first semiconductor chips 100 may be spaced apart from each other by a first scribe lane SR1. A second wafer W2 may be fabricated to include second semiconductor chips 200. The second wafer W2 may include a second upper conductive pad 290 and a second insulation layer 220. The second semiconductor chips 200 also need not yet be divided into pieces, and may be spaced apart from each other by a second scribe lane SR2. The first wafer W1 may be placed on a carrier substrate 1200. When the first wafer W1 is placed on the carrier substrate 1200, the first upper conductive pad 130 may lie adjacent to the carrier substrate 1200. The second wafer W2 may be stacked on the first wafer W1. When the second wafer W2 is stacked on the first wafer W1, the second semiconductor chips 200 may be positioned to correspond to the first semiconductor chips 100 (e.g., with sidewalls of the first and second semiconductor chips 100 and 200 aligned with each other). The first lower conductive pad 190 may come into direct contact with the second upper conductive pad 290. A thermo-compression process may be performed to bond the first wafer W1 and the second wafer W2. Therefore, the first insulation layer 120 and the second insulation layer 220 may be attached to each other, and the first lower conductive pad 190 and the second upper conductive pad 290 may be attached to each other. The first lower conductive pad 190 and the second upper conductive pad 290 may be integrally combined due to heat-induced mutual diffusion of copper included in each of the first lower conductive pad 190 and the second upper conductive pad 290.

The redistribution pattern 203p, 203r, and 203b may be formed on the second bottom surface 201b of the second wafer W2. The second passivation layer 205 may be formed to substantially cover the second bottom surface 201b and the redistribution pattern 203p, 203r, and 203b and to expose a second redistribution conductive pad 203b of the redistribution pattern 203p, 203r, and 203b. For example, a thereto-compression process may be performed to mount third semiconductor chips 300 on the second wafer W2 with a connection structure 400 (e.g., a solder ball) disposed between the second wafer W2 and each of the third semiconductor chips 300. The third semiconductor chips 300 may be positioned to overlap corresponding second semiconductor chips 200.

A simulation process may be subsequently performed to remove the first and second scribe lanes SR1 and SR2 respectively of the first and second wafers W1 and W2, thus separating semiconductor packages 1000a from each other.

Figure 4:
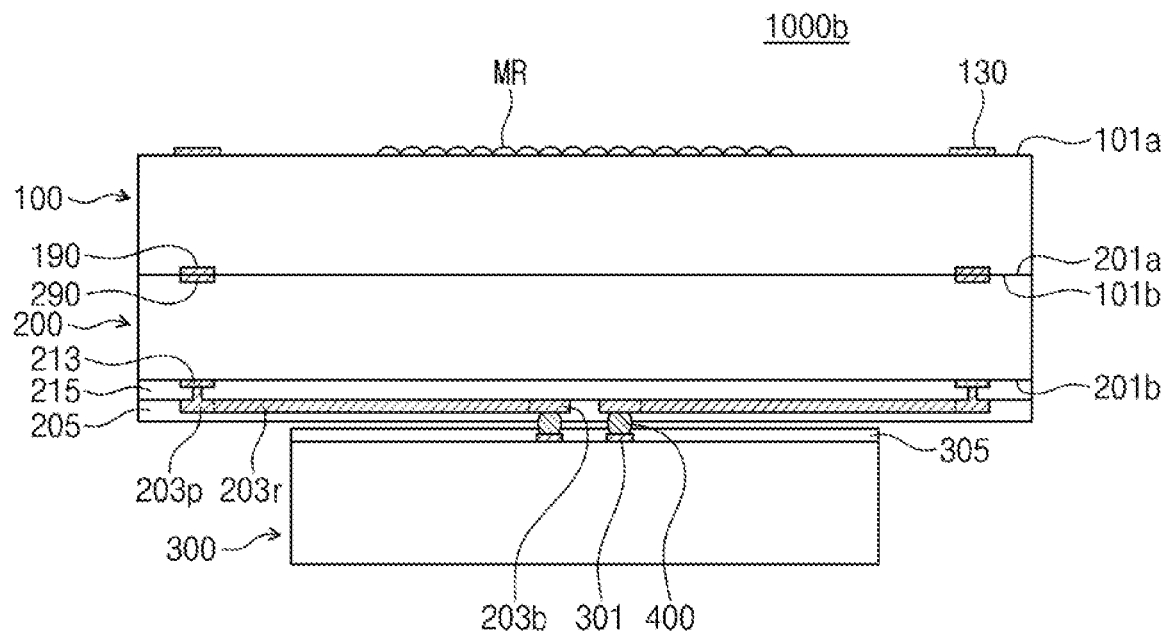
FIG. 4 is a cross-sectional view of a semiconductor package according to an exemplary embodiment of the present inventive concept.

FIG. 4 is a cross-sectional view of a semiconductor package according to an exemplary embodiment of the present inventive concept.

Referring to FIG. 4, a semiconductor package 1000b according to an exemplary embodiment of the present inventive concept may include the redistribution pattern 203p, 203r, and 203b spaced apart from the second bottom surface 201b. A second lower conductive pad 213 may be disposed on the second bottom surface 201b. The second through via TSV2 (see, e.g., FIG. 2) may be coupled with the second lower conductive pad 213. An upper surface of the second lower conductive pad 213 may he aligned with the second bottom surface 201b. The second lower conductive pad 213 may be adjacent to the edge of the second semiconductor chip 200. The second bottom surface 201b may be substantially covered with an intermediate passivation layer 215. The redistribution pattern 203p, 203r, and 203b may be disposed on a bottom surface of the intermediate passivation layer 215. The bottom surface of the intermediate passivation layer 215 may face the third semiconductor chip 300. The first redistribution conductive pad 203p may partially penetrate the intermediate passivation layer 215. The first redistribution conductive pad 203p may be in direct contact with the second lower conductive pad 213. For example, the first redistribution conductive pad 203p may be in direct contact with a lower surface of the second lower conductive pad 213. The other components and features of the first, second and third semiconductor chips 100, 200 and 300 described above in more detail with reference to FIGS. 1A and 1B may similarly apply to the first, second and third logic chips 100, 200 and 300 described with reference to FIG. 4.

Figure 5:
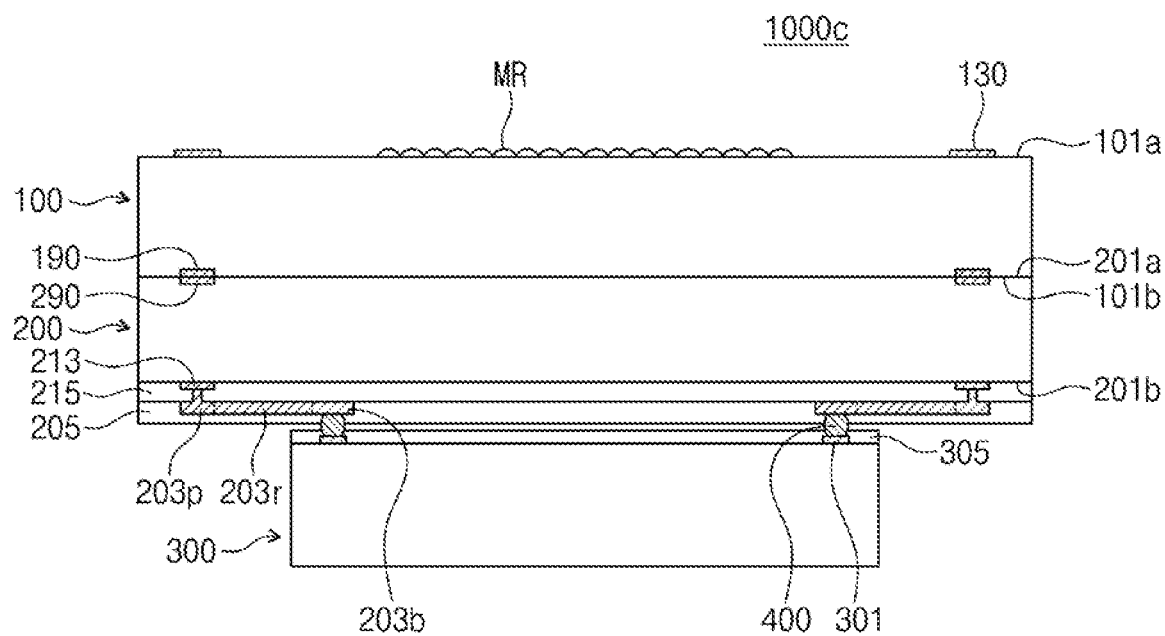
FIGS. 5 and 6 are cross-sectional views of a semiconductor package according to an exemplary embodiment of the present inventive concept.
Figure 6:
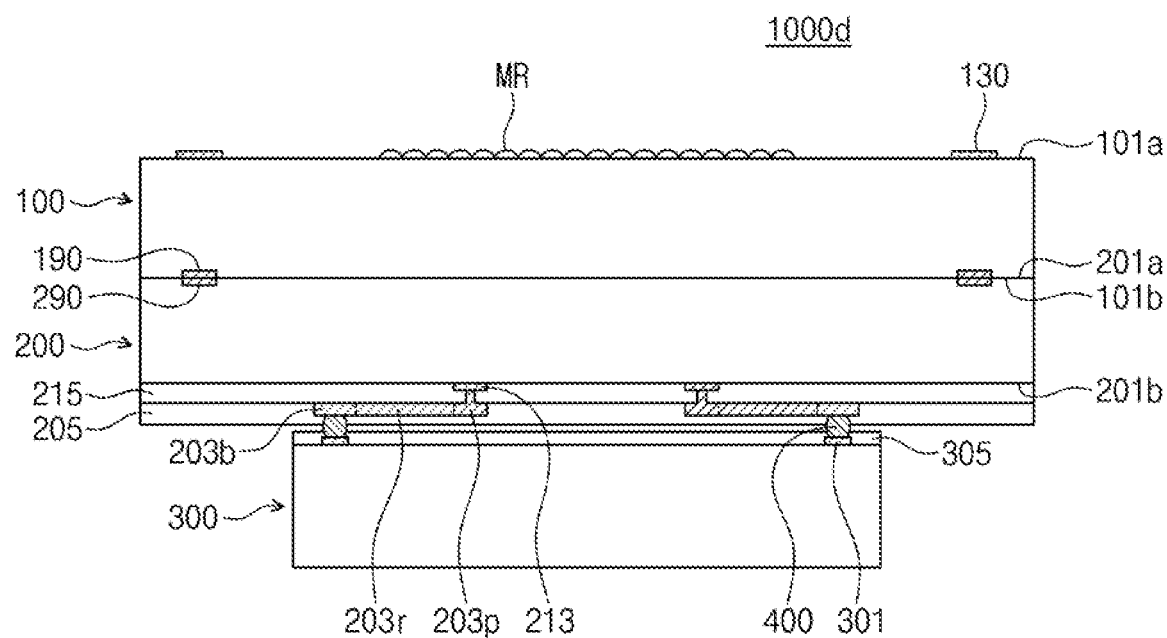

FIGS. 5 and 6 are cross-sectional views of a semiconductor package according to an exemplary embodiment of the present inventive concept.

Referring to FIGS. 5 and 6, any of semiconductor packages 1000c and 1000d according to an exemplary embodiment of the present inventive concept may include the third conductive pad 301 disposed adjacent to an edge of the third semiconductor chip 300 and/or the second lower conductive pad 213 disposed adjacent to the center of the second semiconductor chip 200. The other components and features of the first, second and third semiconductor chips 100, 200 and 300 described above in more detail with reference to FIG. 4 may similarly apply to the first, second and third logic chips 100, 200 and 300 described with reference to FIGS. 5 and 6.

Figure 7:
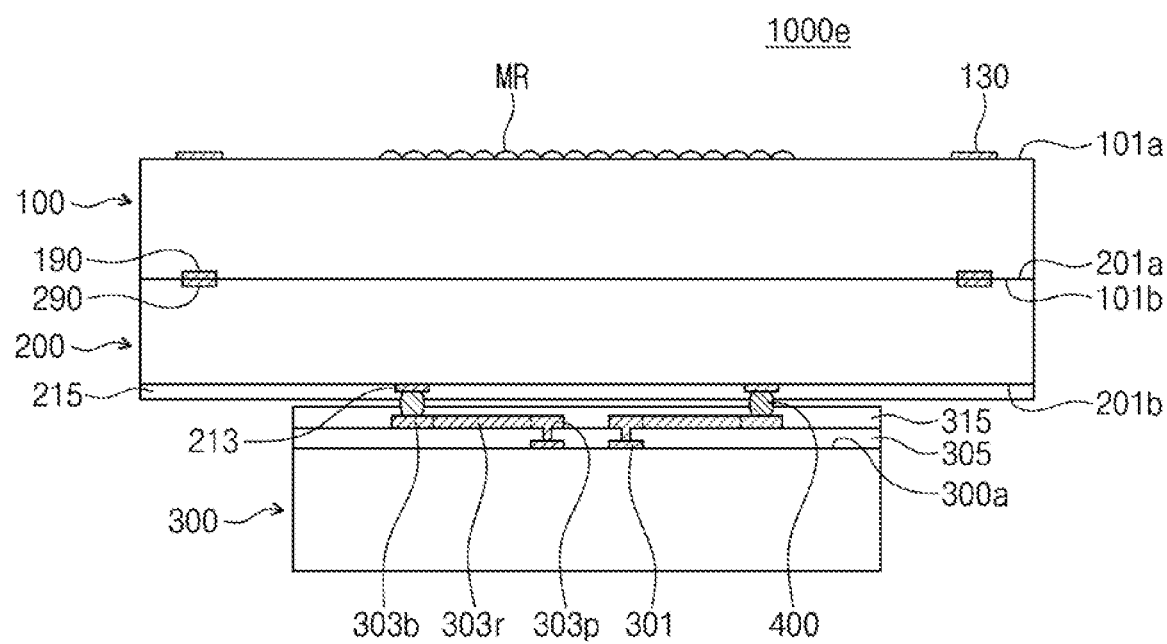
FIG. 7 is a cross-sectional view of a semiconductor package according to an exemplary embodiment of the present inventive concept.

FIG. 7 is a cross-sectional view of a semiconductor package according to an exemplary embodiment of the present inventive concept.

Referring to FIG. 7, a semiconductor package 1000e according to an exemplary embodiment of the present inventive concept may include the third semiconductor chip 300 including a third top surface 300a facing the second semiconductor chip 200 and a second redistribution pattern 303p, 303r, and 303b on the third top surface 300a. The second redistribution pattern 303p, 303r, and 303b may be formed on the third passivation layer 305 of the third semiconductor chip 300. The semiconductor package 1000e might not include redistribution pattern 203p, 203r, and 203b. The second redistribution pattern 303p, 303r, and 303b may include a third redistribution conductive pad 303p, a fourth redistribution conductive pad 303b, and a sixth redistribution line 303r connecting the third and fourth redistribution conductive pads 303p and 303b. The third redistribution conductive pad 303p may penetrate the third passivation layer 305 and may be in direct contact with the third conductive pad 301. An external passivation layer 315 may substantially cover the second redistribution pattern 303p, 303r, and 303b and the third passivation layer 305. The other components and features of the first, second and third semiconductor chips 100, 200 and 300 described above in more detail with reference to FIGS. 1A and 1B may similarly apply to the first, second and third logic chips 100, 200 and 300 described with reference to FIG. 7.

Figure 8:
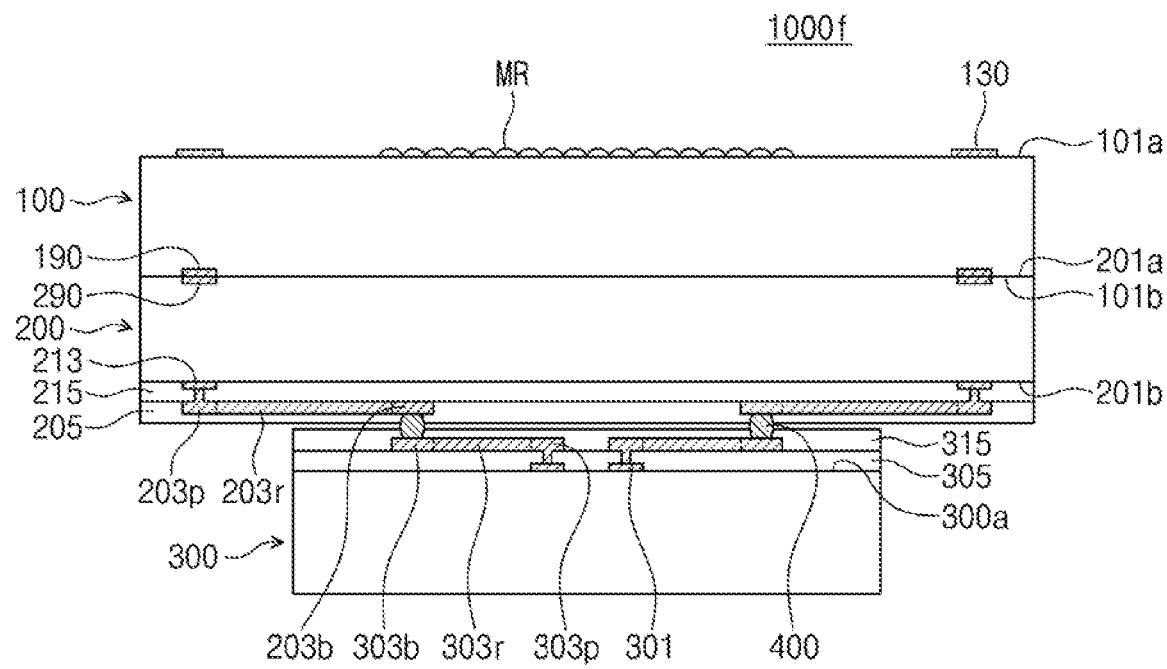
FIG. 8 is a cross-sectional view of a semiconductor package according to an exemplary embodiment of the present inventive concept.

FIG. 8 is a cross-sectional view of a semiconductor package according to an exemplary embodiment of the present inventive concept.

Referring to FIG. 8, a semiconductor package 1000f according to an exemplary embodiment of the present inventive concept may include not only the redistribution pattern 203p, 203r, and 203b but also the second redistribution pattern 303p, 303r, and 303b. The other components and features of the first, second and third semiconductor chips 100, 200 and 300 described above in more detail with reference to FIGS. 4 and 7 may similarly apply to the first, second and third logic chips 100, 200 and 300 described with reference to FIG. 8.

According to an exemplary embodiment of the present inventive concept, a semiconductor package may include an image sensor chip (e.g., semiconductor chip 100). A logic chip (e.g., semiconductor chip 200) may be disposed on the image sensor chip. A memory chip (e.g., semiconductor chip 300) may be spaced apart from the logic chip. Sidewalls of the image sensor chip and the logic chip may be substantially aligned with each other along a direction orthogonal to an upper surface of the image sensor chip. A sidewall of the memory chip may be spaced apart from the sidewalls of the image sensor chip and the logic chip. A first redistribution pattern (e.g., redistribution pattern 203p, 203r and 203b) may be disposed on a surface of the logic chip facing the memory chip. A second redistribution pattern (e.g., redistribution pattern 303p, 303r, and 303b) may be disposed on a surface of the memory chip facing the logic chip. The first redistribution pattern may be electrically connected with the second redistribution pattern. For example, the first redistribution pattern may be electrically connected with the second redistribution pattern by connection structure 400.

As an example, a first portion of the first redistribution pattern may overlap a first portion of the second redistribution pattern, and a second portion of the first redistribution pattern may be spaced apart from a second portion of the second redistribution pattern.

Figure 9:
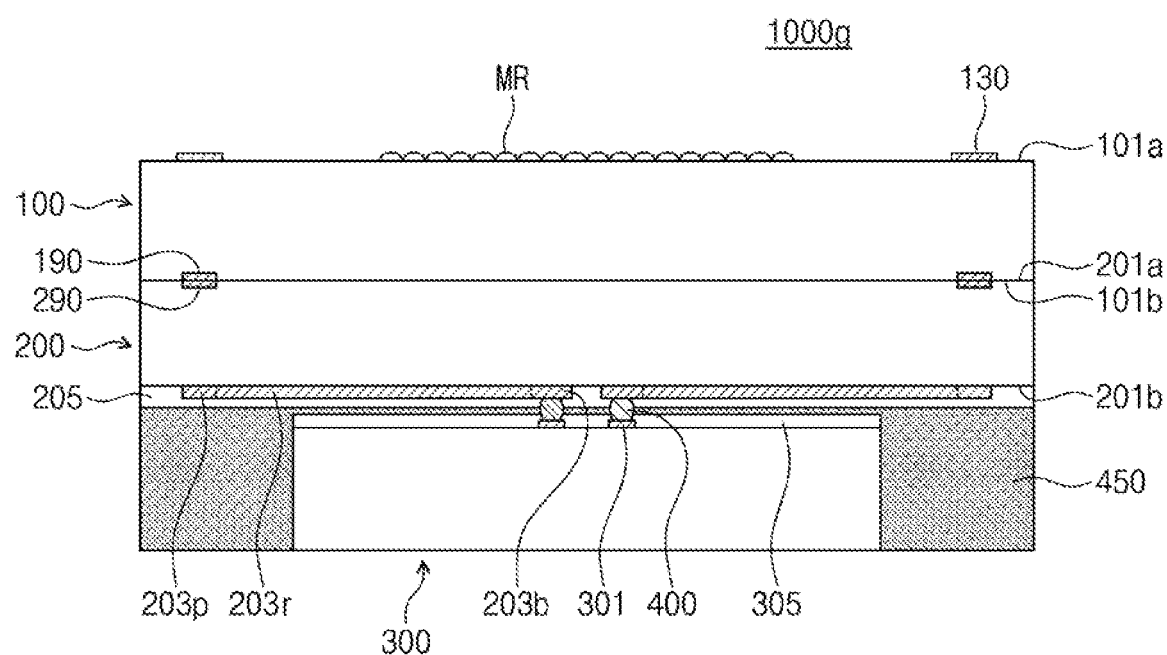
FIG. 9 is a cross-sectional view of a semiconductor package according to an exemplary embodiment of the present inventive concept.

FIG. 9 is a cross-sectional view of a semiconductor package according to an exemplary embodiment of the present inventive concept.

Referring to FIG. 9, a semiconductor package 1000g according to an exemplary embodiment of the present inventive concept may include a mold layer 450 substantially covering a lateral surface of the third semiconductor chip 300 and a bottom surface of the second passivation layer 205, in addition to the components described in more detail above with reference to FIG. 1B. The mold layer 450 may have a bottom surface coplanar with that of the third semiconductor chip 300. The mold layer 450 may be partially disposed between the second semiconductor chip 200 and the second semiconductor chip 300. The other components and features of the first, second and third semiconductor chips 100, 200 and 300 described above in more detail with reference to FIGS. 1A and 1B may similarly apply to the first, second and third logic chips 100, 200 and 300 described with reference to FIG. 9.

Figure 10:
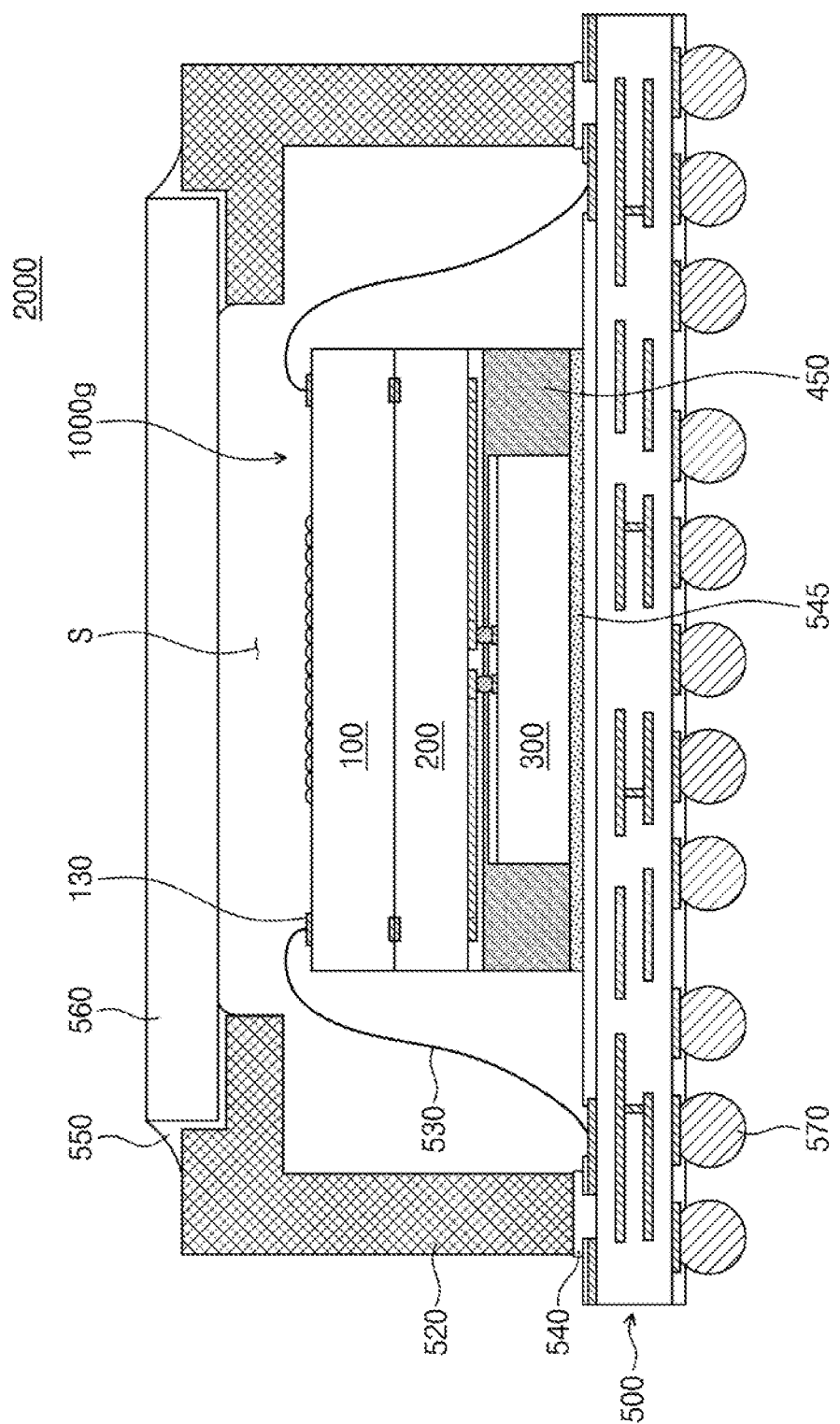
FIG. 10 is a cross-sectional view of a semiconductor package module according to an exemplary embodiment of the present inventive concept.

FIG. 10 is a cross-sectional view of a semiconductor package module according to an exemplary embodiment of the present inventive concept.

Referring to FIG. 10, a semiconductor package module 2000 according to an exemplary embodiment of the present inventive concept may include a first adhesive layer 545 attaching the semiconductor package 1000g of FIG. 9 onto a package substrate 500. The first adhesive layer 545 may be disposed between the mold layer 450 and the package substrate 500. A wire 530 may connect the package substrate 500 to the first upper conductive pad 130 of the first semiconductor chip 100. A holder 520 may be disposed on the package substrate 500. The holder 520 may be spaced apart from the semiconductor package 1000g. A second adhesive layer 540 may attach the holder 520 onto the package substrate 500. The holder 520 may have a closed loop shape in a plan view. The holder 520 may be adjacent to an edge of the semiconductor package 1000g and may have a hollow structure. The holder 520 may include a polymeric material such as polyamide. A third adhesive layer 550 may attach a transparent substrate 560 onto the holder 520. The transparent substrate 560 may include transparent glass or plastic. The transparent substrate 560 may be spaced apart from the semiconductor package 1000g, providing an empty space S. A solder bump 570 may be attached to a lower portion of the package substrate 500. Although FIG. 10 shows the semiconductor package 1000g (see, e.g., FIG. 9), the semiconductor package 1000g may be replaced with any of the semiconductor packages 1000, 1000a, 1000b, 1000c, 1000d, 1000e, or 1000f (see, e.g., FIGS. 1B, 2, and 4 to 8). Alternatively, the semiconductor package module 2000 may include a combination of the semiconductor packages 1000 and 1000a to 1000g.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor package, comprising:
a first semiconductor chip;
a second semiconductor chip below the first semiconductor chip; and
a third semiconductor chip below the second semiconductor chip,
wherein the second semiconductor chip comprises:
a first surface in direct contact with the first semiconductor chip;
a second surface facing the third semiconductor chip; and
a first redistribution pattern on the second surface of the second semiconductor chip and electrically connected to the third semiconductor chip,
wherein the third semiconductor chip comprises:
a third surface facing the second semiconductor chip; and
a conductive pad on the third surface,
wherein the first semiconductor chip comprises a first semiconductor substrate and a first insulation layer on the first semiconductor substrate,
wherein the second semiconductor chip comprises a second semiconductor substrate and a second insulation layer on the second semiconductor substrate,
wherein a top surface of the second insulation layer corresponds to the first surface to the second semiconductor chip,
wherein a bottom surface of the second semiconductor substrate corresponds to the second surface of the second semiconductor chip, and
wherein the second insulation layer is in direct contact with the first insulation layer.

2. The package of claim 1, wherein
the first semiconductor chip and the second semiconductor chip have sidewalk vertically aligned with each other, and
the third semiconductor chip has a sidewall that is not vertically aligned with the sidewall of the second semiconductor chip.

3. The package of claim 1, wherein the second semiconductor chip further comprises:
a wiring line in the second insulation layer; and
a through via penetrating the second semiconductor substrate and electrically connecting the wiring line and the first redistribution pattern.

4. The package of claim 3, wherein the second semiconductor chip is electrically connected with the third semiconductor chip by an electrical connection spaced apart from the through via.

5. The package of claim 3, wherein the through via is disposed at an edge of the second semiconductor chip.

6. The package of claim 1, wherein the third semiconductor chip has a width less than that of the second semiconductor chip.

7. The package of claim 6, further comprising a mold layer substantially covering a lateral surface of the third semiconductor chip and a lower portion of the second semiconductor chip.

8. The package of claim 1, wherein
the first semiconductor chip is an image sensor chip,
the second semiconductor chip is a logic chip that drives the image sensor chip, and
the third semiconductor chip is a memory chip that stores data generated in the logic chip.

9. The package of claim 8, wherein the memory chip is a dynamic random access memory (DRAM) chip.

10. A semiconductor package, comprising;
a first semiconductor chip;
a second semiconductor chip below the first semiconductor chip; and
a third semiconductor chip below the second semiconductor chip,
wherein the first semiconductor chip and the second semiconductor chip have sidewalls aligned with each other,
wherein the third semiconductor chip has a width less than that of the second semiconductor chip, and
wherein the third semiconductor chip comprises a first surface facing the second semiconductor chip, a conductive pad in direct contact with the first surface and a first redistribution pattern in direct contact with the conductive pad on the first surface.

11. The package of claim 10, wherein
the first semiconductor chip and the second semiconductor chip are in direct contact with each other, and
the second semiconductor chip and the third semiconductor chip are spaced apart from each other.

12. The package of claim 10, wherein
the first semiconductor chip comprises a first semiconductor substrate and a first insulation layer on the first semiconductor substrate, and
the second semiconductor chip comprises a second semiconductor substrate and a second insulation layer on the second semiconductor substrate,
wherein the second insulation layer is in direct contact with the first insulation layer.

13. The package of claim 12, wherein the second semiconductor chip further comprises:
a wiring line in the second insulation layer;
a through via penetrating the second semiconductor substrate and electrically connecting the wiring line and the first redistribution pattern;
a second surface facing the third semiconductor chip; and
a second redistribution pattern on the second surface.

14. The package of claim 13, wherein the second semiconductor chip is electrically connected with the third semiconductor chip by an electrical connection spaced apart from the through via.

15. The package of claim 10, further comprising a mold layer substantially covering a lateral surface of the third semiconductor chip and a lower portion of the second semiconductor chip.

16. The package of claim 10, wherein
the first semiconductor chip is an image sensor chip,
the second semiconductor chip is a logic chip that drives the image sensor chip, and
the third semiconductor chip is a memory chip that stores data generated in the logic chip.

17. The package of claim 16, wherein the third semiconductor chip is a dynamic random access memory (DRAM) chip.

18. A semiconductor package, comprising:
an image sensor chip;
a logic chip disposed on the image sensor chip;
a memory chip spaced apart from the logic chip, wherein sidewalk of the image sensor chip and the logic chip are substantially aligned with each other along a direction orthogonal to an upper surface of the image sensor chip, and wherein a sidewall of the memory chip is spaced apart from the sidewails of the image sensor chip and the logic chip;
a first redistribution pattern disposed on a surface of the logic chip facing the memory chip; and
a second redistribution pattern disposed on a surface of the memory chip facing the logic chip, wherein the first redistribution pattern is electrically connected with the second redistribution pattern.

19. The semiconductor package of claim 18, wherein a first portion of the first redistribution pattern overlaps a first portion of the second redistribution pattern, and wherein a second portion of the first redistribution pattern is spaced apart from a second portion of the second redistribution pattern.

* * * * *